United States Patent
Ben-Tzur et al.

(10) Patent No.: US 6,903,002 B1
(45) Date of Patent: Jun. 7, 2005

(54) LOW-K DIELECTRIC LAYER WITH AIR GAPS

(75) Inventors: Mira Ben-Tzur, Sunnyvale, CA (US); Krishnaswamy Ramkumar, San Jose, CA (US); Christopher A. Seams, Pleasanton, CA (US); Thurman J. Rodgers, Woodside, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/241,236

(22) Filed: Sep. 11, 2002

(51) Int. Cl.[7] .................... H01L 21/4763; H01L 21/302
(52) U.S. Cl. ............... 438/622; 438/623; 438/624; 438/631; 438/633; 257/752; 257/758
(58) Field of Search .................. 438/619, 622–624, 438/631, 633; 257/752, 758, 786

(56) References Cited

U.S. PATENT DOCUMENTS

| | | | |
|---|---|---|---|
| 5,847,464 A | * 12/1998 | Singh et al. | 257/752 |
| 6,251,799 B1 | * 6/2001 | Lai et al. | 438/760 |
| 6,387,797 B1 | * 5/2002 | Bothra et al. | 438/619 |
| 6,522,005 B1 | 2/2003 | Allman et al. | |

* cited by examiner

Primary Examiner—Donghee Kang
(74) Attorney, Agent, or Firm—Okamoto & Benedicto LLP

(57) ABSTRACT

In one embodiment, a metal level includes a plurality of metal lines. A low-k dielectric is deposited over the metal level such that an air gap forms at least between two metal lines. The relatively low dielectric constant of the low-k dielectric reduces capacitance on metal lines regardless of whether an air gap forms or not. The air gap in the low-k dielectric further reduces capacitance on metal lines. The reduced capacitance translates to lower RC delay and faster signal propagation speeds.

8 Claims, 6 Drawing Sheets

LOW-K DIELECTRIC LAYER WITH AIR GAPS

BACKGROUND OF THE INVENTION

1. Field of the Invention

The present invention relates generally to integrated circuits, and more particularly to integrated circuit fabrication processes and structures.

2. Description of the Background Art

The speed at which a signal is propagated in an integrated circuit is limited by the delay through the metal line carrying the signal. This delay, commonly known as "RC delay," is determined by the product of the resistance (R) and capacitance (C) of the metal line. Reducing the resistance and/or capacitance of a metal line lowers its RC delay and increases signal propagation speed. Thus, reducing the RC delay of metal lines plays a major role in making integrated circuits run faster.

SUMMARY

In one embodiment, a metal level includes a plurality of metal lines. A low-k dielectric is deposited over the metal level such that an air gap forms at least between two metal lines. The relatively low dielectric constant of the low-k dielectric reduces capacitance on metal lines regardless of whether an air gap forms or not. The air gap in the low-k dielectric further reduces capacitance on metal lines. The reduced capacitance translates to lower RC delay and faster signal propagation speeds.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not to scale unless otherwise noted.

DETAILED DESCRIPTION

In the present disclosure, numerous specific details are provided such as examples of materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The present invention relates to methods and associated structures for lowering the RC delay of metal lines in integrated circuits. The resistance of a metal line, and hence its RC delay, may be lowered by using a low resistance material such as copper to form the metal line. To reduce capacitance, so-called low-k dielectrics may be deposited between metal lines. A low-k dielectric is a dielectric material that has relatively low dielectric constant. Commercially available low-k dielectrics have a dielectric constant less than or equal to about 3.9 (i.e., $k \leq 3.9$).

Figure 1:
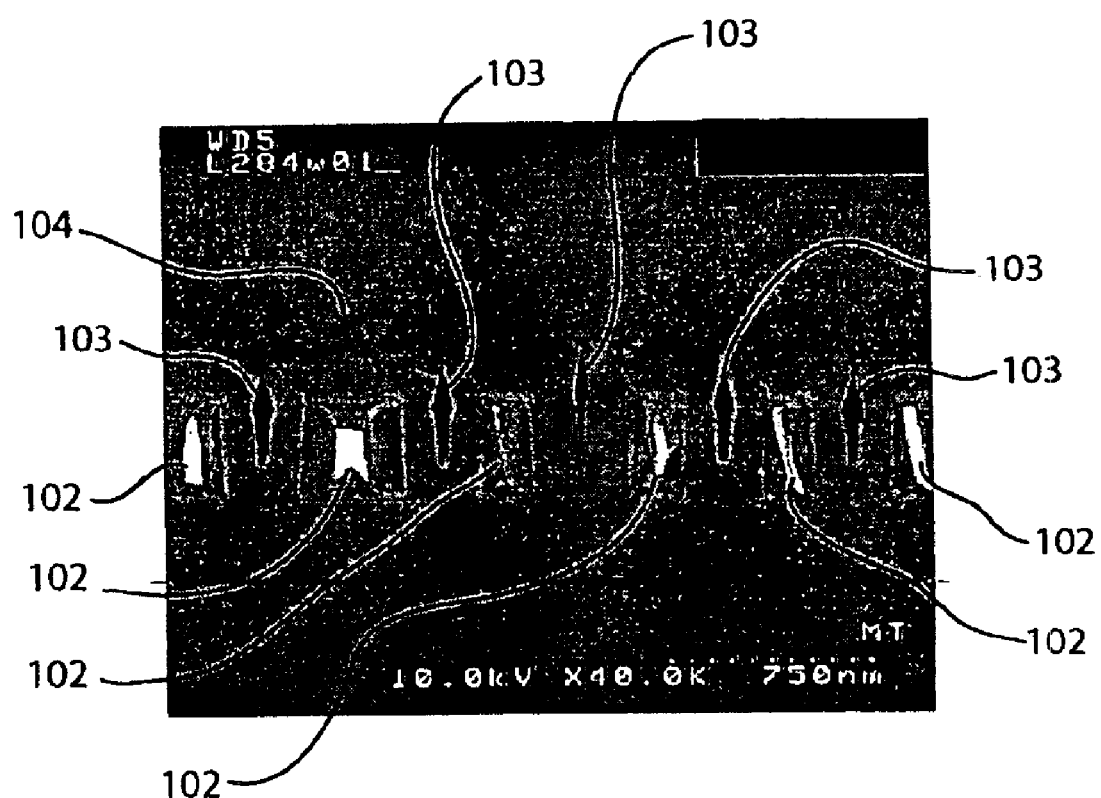
FIG. 1 shows a scanning electron micrograph of a cross-section of an integrated circuit.

A region with low dielectric constant may also be formed by depositing silicon dioxide over metal lines. Silicon dioxide may be deposited by plasma-enhanced chemical vapor deposition (PECVD) using TEOS (tetraethyl ortho-silicate) as a precursor. The inability of silicon dioxide to completely fill narrow gaps results in air gaps between narrowly spaced metal lines. Although silicon dioxide itself is not a low-k dielectric (silicon dioxide has a dielectric constant approximately equal to 4), the unity dielectric constant of the air gaps helps lower capacitance. However, the formation of the air gaps is not controllable, and their size varies depending on metal line spacing. In situations where air gaps do not form, the relatively high dielectric constant of silicon dioxide becomes a disadvantage. Thus, the use of silicon dioxide as a dielectric material may or may not help in reducing capacitance. FIG. 1 shows a scanning electron micrograph of a cross-section of an integrated circuit with air gaps 103 between metal lines 102. Air gaps 103 resulted from the lack of gap-fill capability of silicon dioxide 104.

Figure 2A:
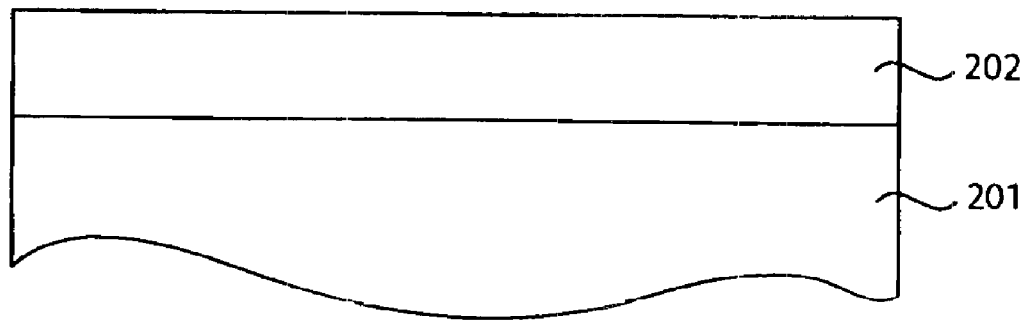
FIGS. 2(a)–2(e) schematically show side cross-sectional views of an integrated circuit being fabricated in accordance with an embodiment of the present invention.

FIGS. 2(a)–2(e) schematically show side cross-sectional views of an integrated circuit being fabricated in accordance with an embodiment of the present invention. In FIG. 2(a), a metal 202 is deposited over a dielectric level 201. It is to be noted that as used in the present disclosure, the terms "over", "overlying", "under" and "underlying" refer to the relative placement of two materials that may or may not be directly in contact with each other. That is, the two materials may be separated by another material.

Dielectric level 201 may be a first dielectric level. That is, dielectric level 201 may be a dielectric level just above a substrate (not shown). Dielectric level 201 may also be over other dielectric levels. Dielectric level 201 may be a layer of silicon dioxide deposited by PECVD, for example.

Metal 202 may be a layer of interconnect material. For example, metal 202 may be a layer of aluminum deposited by physical vapor deposition. Metal 202 may also be a metal stack. For example, metal 202 may be a stack (not shown) that includes a 300 Angstroms thick titanium layer deposited on dielectric level 201, an 8000 Angstroms thick aluminum layer deposited on the titanium layer, and a 300 Angstroms thick titanium-tungsten (or titanium-nitride) layer deposited on the aluminum layer.

Figure 2B:
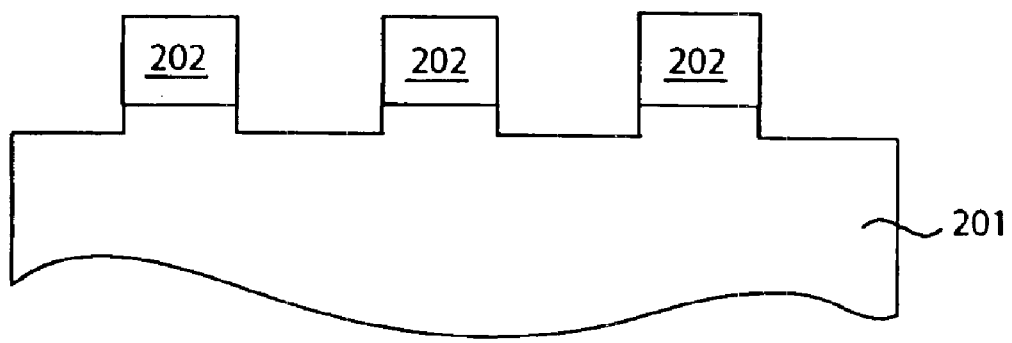

In FIG. 2(b), metal 202 is patterned and etched to form "metal lines 202". Metal lines 202 may be formed by over-etching, resulting in some gouging into dielectric level 201. Metal lines 202 may serve as conductive lines for carrying electrical signals in the integrated circuit. Metal lines 202 may be in a first metal level also referred to as the "M1" level. That is, metal lines 202 may be in a first metal relative to a substrate (not shown). Metal lines 202 may also be in a topmost or in an intermediate metal level.

Figure 2C:
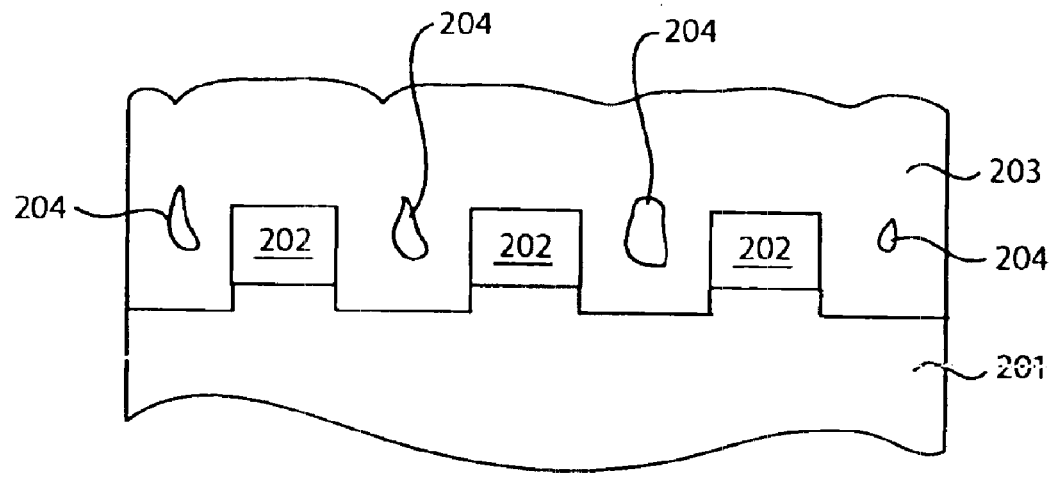

In FIG. 2(c), a layer 203, which comprises a low-k dielectric with no gap-fill capability, is deposited over (and thus between) metal lines 202. Layer 203 may have a dielectric constant less than or equal to about 3.9 (i.e., $k \leq 3.9$). Additionally, layer 203 has no gap-fill capability in that it has poor step coverage. The poor step coverage makes it difficult to substantially fill small gaps between metal lines 202, thereby creating air gaps 204. The unity dielectric constant of air gaps 204 and the relatively low dielectric constant of layer 203 help reduce capacitance on metal lines 202. The reduced capacitance translates to lower RC delay and faster signal propagation speeds.

The size and formation of air gaps 204 may vary depending on the profile of metal lines 202 and the spacing between them. Air gaps 204 may get bigger as the spacing between metal lines 202 gets narrower. Conversely, air gaps 204 may get smaller as the spacing between metal lines 202 widens. Layer 203 is thus preferably deposited on narrowly spaced metal lines. For example, layer 203 is particularly effective when deposited on metal lines that are approximately 0.14 μm to 1 μm apart. As another example, layer 203 may be advantageously deposited on metal lines that are spaced about 0.18 μm or less apart.

Low-k dielectrics with no gap-fill capability are typically employed in damascene processes. In a damascene process, a low-k dielectric with no-gap fill capability is deposited on a relatively flat surface. The low-k dielectric is then etched to form trenches. Thereafter, copper is electroplated into the trenches. The copper is then polished to form a relatively flat surface. Thus, gap-fill is typically not a major consideration in a damascene process. In contrast, embodiments of the present invention specifically take advantage of the lack of gap-fill capability of some low-k dielectrics to reduce capacitance on metal lines in subtractive or non-damascene processes.

Still referring to FIG. 2(c), layer 203 may be a commercially available low-k dielectric with no gap-fill capability. For example, layer 203 may be a layer of fluorinated silica glass (FSG) film with no gap-fill capability from Novellus Systems, Inc. of San Jose, Calif. or Applied Materials of Santa Clara, Calif. FSG films with no gap-fill capability may be deposited by PECVD, for example. Other commercially available low-k dielectrics with no gap-fill capability may also be used. For example, layer 203 may be a layer of Coral™ film also from Novellus Systems, Inc. Compared to Coral™ films, FSG films with no gap-fill capability are preferable because they result in better planarity when deposited on narrowly spaced metal lines.

As can be appreciated by those of ordinary skill in the art reading the present disclosure, the relatively low dielectric constant of layer 203 helps reduce capacitance on metal lines 202 regardless of whether air gaps 204 form or not. Layer 203 provides the additional advantage of further reducing capacitance in situations where air gaps 204 do form.

Figure 2D:
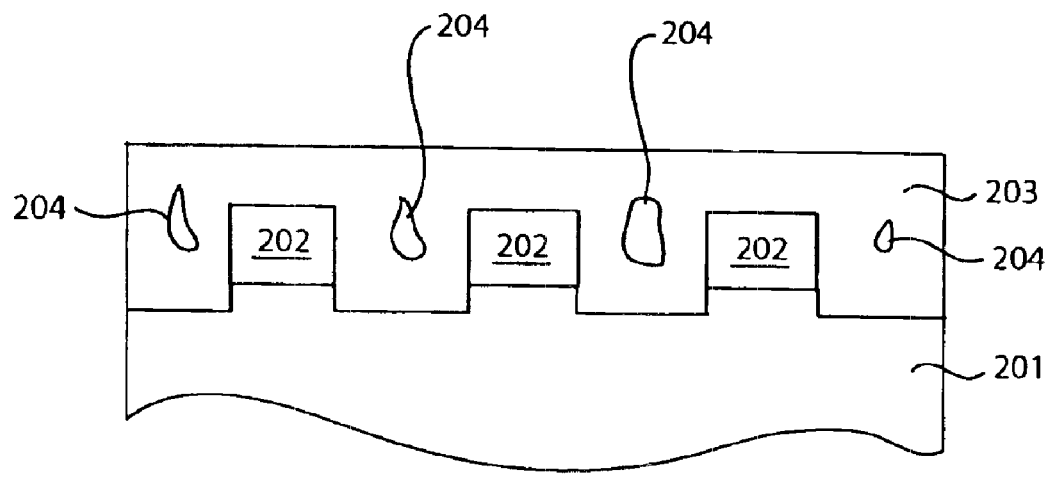

Continuing in FIG. 2(d), layer 203 is planarized by chemical-mechanical polishing (CMP).

Figure 2E:
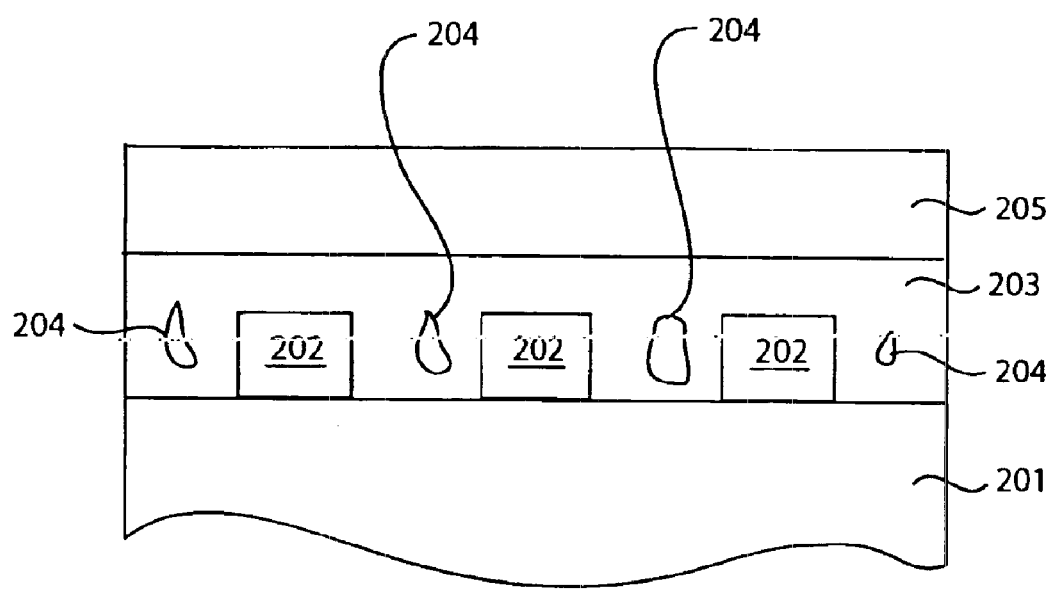

In FIG. 2(e), a layer 205 is deposited over layer 203. Layer 205 may be a capping layer for protecting layer 203 and other underlying layers. For example, layer 205 may be of a capping material such as silicon dioxide deposited by PECVD. Layer 205 may also be part of a dielectric level.

Figure 3A:
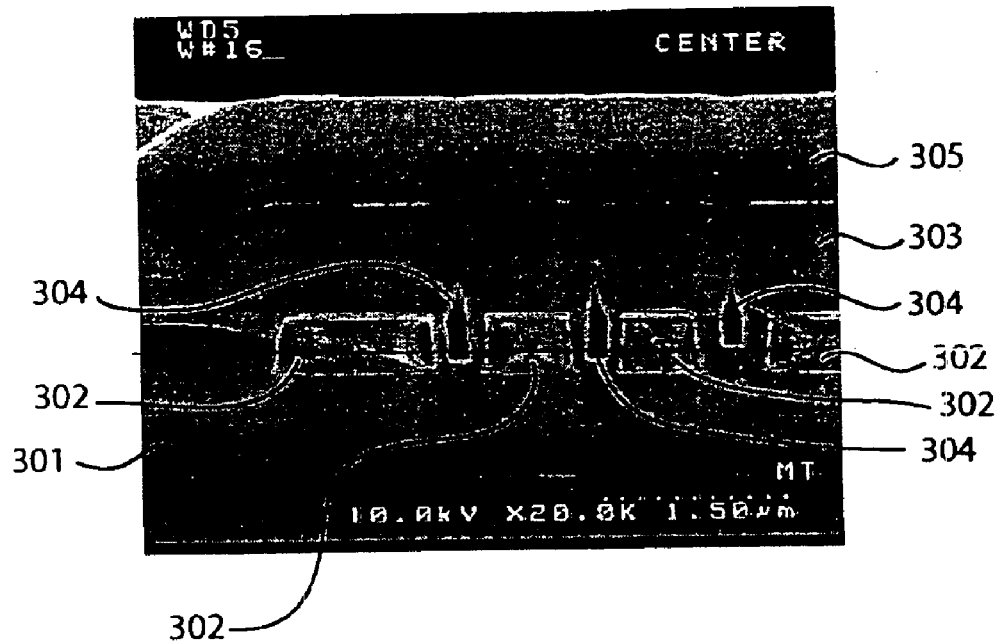
FIGS. 3(a) and 3(b) show scanning electron micrographs of side cross-sections of an integrated circuit in accordance with an embodiment of the present invention.
Figure 3B:
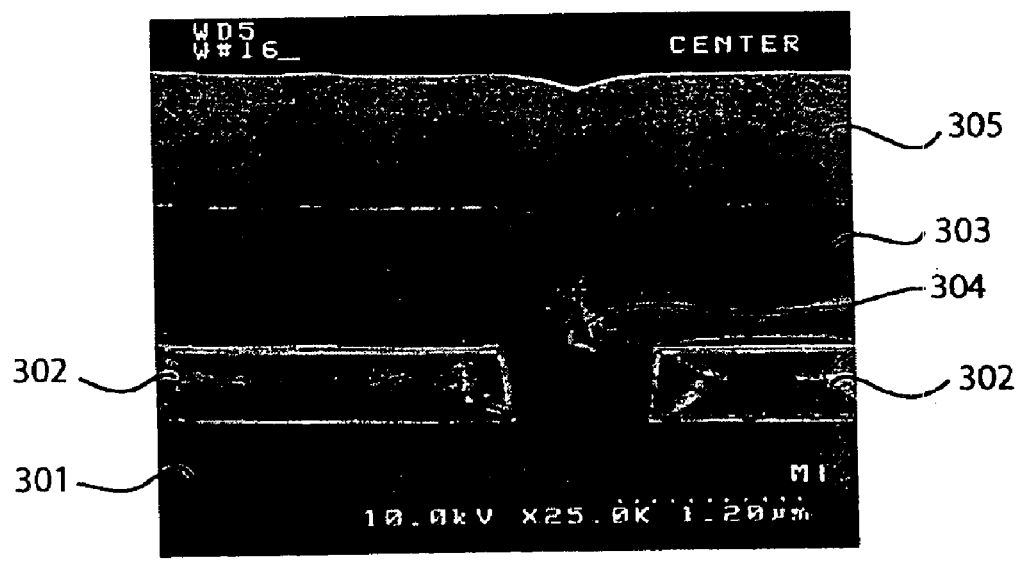

FIGS. 3(a) and 3(b) show scanning electron micrographs of side cross-sections of an integrated circuit in accordance with an embodiment of the present invention. In FIGS. 3(a) and 3(b), layer 303 is a layer of FSG film with no gap-fill capability deposited by PECVD, layer 301 is a layer of silicon dioxide deposited by PECVD, layer 305 is a layer of silicon nitride deposited by PECVD, and metal lines 302 are metal stacks comprising aluminum. Layer 305 protects underlying materials during a solvent bath, which is performed to enhance the clarity of the micrographs. Metal lines 302 are on a first metal level.

The micrograph of FIG. 3(a) was taken in a section of the integrated circuit where the spacing between metal lines 302 is about 0.18 μm, while the micrograph of FIG. 3(b) was taken in a section of the integrated circuit where the spacing between metal lines 302 is about 0.8 μm. Comparing FIGS. 3(a) and 3(b), air gaps 304 in FIG. 3(a) are larger than those in FIG. 3(b). This is due to the narrower spacing of metal lines 302 in FIG. 3(a). The relatively low dielectric constant of layer 303 helps reduce capacitance on metal lines 302. The resulting air gaps 304, regardless of size, further helps reduce capacitance on metal lines 302. Because air gaps 304 have a dielectric constant approximately equal to 1, air gaps 304 result in reduced capacitance and RC delay.

Figure 4:
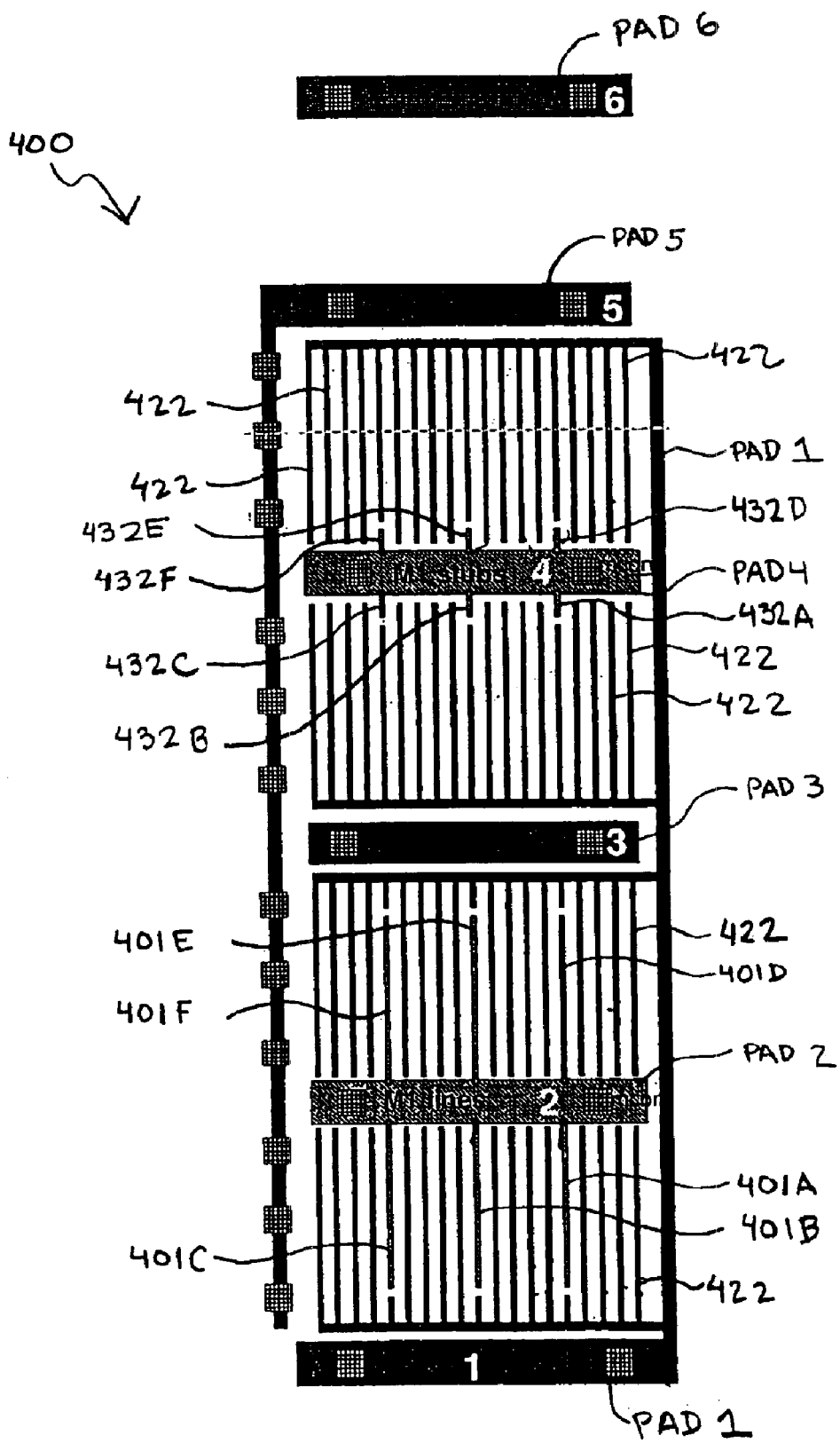
FIG. 4 schematically shows a top view of a test structure employed in an experiment.

FIG. 4 schematically shows a top view of a test structure 400 employed in an experiment. The metal lines and pads of a test structure 400 are formed prior to depositing a dielectric over the test structure. A dielectric deposited over a test structure 400 thus gets deposited between metal lines.

As shown in FIG. 4, a test structure 400 includes metal pads 1, 2, 3, 4, 5, and 6. Metal pad 1 is electrically connected to metal lines referred to as grid lines 422. Not all of grid lines 422 are labeled in FIG. 4 for clarity of illustration. Metal pad 2 is electrically connected to several metal lines referred to as metal lines 401 (i.e., 401A, 401B, ... ). Metal lines 401 are approximately 70 μm in length. Metal pad 4 is similar to metal pad 2 except that metal pad 4 is electrically connected to short (e.g., 1 μm) metal lines referred to as metal lines 432 (i.e., 432A, 432B, ... ). Metal pads 3, 5, and 6 serve no significant function in the experiment. In test structure 400, the spacing between metal lines (i.e., metal lines 401, grid lines 422, and metal lines 432) is approximately 0.18 μm.

Dielectrics may be deposited on test structures 400 to determine the resulting capacitance on metal lines 401. For example, a first dielectric may be deposited over a test structure 400, thereby depositing the first dielectric between metal lines 401, grid lines 422, and metal lines 432. The resulting capacitance on metal lines 401 may then be measured. Afterwards, a second dielectric may be deposited over another test structure 400, and so on.

To measure the resulting capacitance on metal lines 401, metal pads 1, 3, 4, 5, and 6 are grounded. An LCR (inductance, capacitance, resistance) meter, such as those of the type available from the Hewlett-Packard company, may then be used across the grounded metal pads and metal pad 2 to get a first capacitance measurement. The first capacitance measurement provides the capacitance of metal pad 2 plus the capacitance of metal lines 401. To determine the capacitance of metal lines 401 separately, the capacitance of metal pad 2 may be determined and then subtracted from the first capacitance measurement. For this purpose, metal pad 4 is configured similar to metal pad 2 except for the relatively short metal lines 432. Thus, the capacitance of metal pad 4 is approximately the same as that of metal pad 2 alone. Grounding metal pads 1, 2, 3, 5, and 6 and using an LCR meter across the grounded metal pads and metal pad 4 give a second capacitance measurement, which represents the capacitance of metal pad 2 without metal lines 401. Subtracting the second capacitance measurement from the first capacitance measurement thus provides the capacitance of metal lines 401.

TABLE 1

MATERIALS EVALUATED AS PART OF AN EXPERIMENT

| Material | K value | Gap-fill? |
| --- | --- | --- |
| Silicon Dioxide (TEOS precursor) | 4 | NO |
| FSG with no gap-fill | 3.5 | NO |
| FSG with gap-fill | 3.5 | YES |
| Coral ™ | 2.8 | NO |
| Flowfill ™ | 2.9 | YES |
| SiLK ™ | 2.6 | YES |

Table 1 lists several dielectrics that were deposited over test structures 400 as part of the experiment. Referring to Table 1, the FSG film with no gap-fill, the FSG film with gap-fill, and the Coral™ film are commercially available from Novellus Systems, Inc. The Flowfill™ film is commercially available from Trikon Technologies of the United Kingdom. The Silk™ film is commercially available from The Dow Chemical Company. The aforementioned materials were deposited over test structure 400 in accordance with their respective manufacturers specifications. Table 1 also lists the approximate dielectric constant of each material and whether the material has gap-fill capability. The silicon dioxide, the FSG film with no gap-fill, and the Coral™ film do not have gap-fill capability and thus resulted in air gaps between metal lines 401.

TABLE 2

CAPACITANCE MEASUREMENTS

|  | Silicon Dioxide (TEOS precursor) | FSG with gap-fill | FSG with no gap-fill | Coral ™ | Flow-fill ™ | Silk ™ |
|---|---|---|---|---|---|---|
| Sample 1 | 0.97 pF | 0.768 pF | 0.687 pF | 0.706 pF | 0.862 pF | 0.834 pF |
| Sample 2 | 0.96 pF | 0.785 pF | 0.687 pF | 0.745 pF | 0.856 pF | 0.819 pF |
| Sample 3 | 0.96 pF | 0.778 pF | 0.711 pF | 0.776 pF | 0.849 pF | 0.804 pF |
| Sample 4 |  |  | 0.681 pF | 0.775 pF |  | 0.812 pF |
| Average | 0.96 pF | 0.79 pF | 0.69 pF | 0.75 pF | 0.86 pF | 0.81 pF |
| STDEV | 0.0058 | 0.0021 | 0.013 | 0.033 | 0.0065 | 0.0075 |
| IMPROVEMENT OVER STD. |  | 18% | 28% | 22% | 11% | 16% |

Table 2 lists the results of capacitance measurements for the various dielectrics. As shown in Table 2, the FSG film with no gap-fill capability resulted in an average capacitance of 0.69 pF (pico Farad) whereas the Coral™ film resulted in an average capacitance of 0.75 pF. The FSG film with no gap-fill resulted in lower capacitance compared to the Coral™ film despite the fact that the Coral™ film has a lower dielectric constant. Also, the low-k dielectrics with no gap-fill capability (i.e., the FSG film with no gap-fill and Coral™ film) resulted in lower capacitance compared to those with gap-fill capability. Additionally, compared to silicon dioxide, the low-k dielectrics (with or without gap-fill) resulted in lower capacitance. The measurement results of Table 2 suggest that low-k dielectrics help lower capacitance on metal lines. Additionally, low-k dielectrics with no gap-fill capability may result in even lower capacitance because they allow for the formation of air gaps between narrowly spaced metal lines.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A method of fabricating an integrated circuit comprising:

forming a plurality of metal lines in a metal level, each metal line in the plurality of metal lines comprising a metal stack, at least two metal lines in the plurality of metal lines being spaced about 0.18 microns or less apart, wherein said metal stack comprises titanium layer, aluminum layer and titanium-tungsten layer;

depositing a low-k dielectric over the plurality of metal lines such that an air gap is created at least between two metal lines in the plurality of metal lines, the low-k dielectric having a dielectric constant less than or equal to about 3.9;

planarizing an entire surface of the low-k dielectric; and depositing a capping layer over the low-k dielectric such that the low-k dielectric forms a dielectric layer consisting substantially only of the low-k dielectric and air gaps.

2. The method of claim 1 wherein the metal level is a first metal level.

3. The method of claim 1 wherein the metal level is over a dielectric level comprising silicon dioxide.

4. The method of claim 1 wherein the capping layer comprises silicon dioxide.

5. A method of forming an integrated circuit, the method comprising:

forming a plurality of metal lines in a metal level, each metal line in the plurality of metal lines comprising a metal stack, at least two metal lines in the plurality of metal lines being spaced about 0.18 microns or less apart, wherein said metal stack comprises titanium layer, aluminum layer and titanium-tungsten layer;

depositing a low-k dielectric over the plurality of metal lines such that air gaps are formed in the low-k dielectric, the low-k dielectric being deposited using a plasma process;

planarizing an entire surface of the low-k dielectric; and depositing a capping layer over the low-k dielectric such that the low-k dielectric forms a dielectric layer consisting substantially only of the low-k dielectric and the air gaps.

6. The method of claim 5 wherein the low-k dielectric has a dielectric constant less than or equal to about 3.9.

7. The method of claim 5 wherein the metal level is a first metal level.

8. The method of claim 5 wherein the metal level is over a dielectric level comprising silicon dioxide.

* * * * *